United States Patent [19]

Abrokwah et al.

[11] Patent Number: 5,693,544
[45] Date of Patent: Dec. 2, 1997

[54] N-TYPE HIGFET AND METHOD

[75] Inventors: Jonathan K. Abrokwah, Tempe; Rodolfo Lucero, Scottsdale; Jeffrey A. Rollman, Phoenix, all of Ariz.

[73] Assignee: Motorola, Inc., Schaumburg, Ill.

[21] Appl. No.: 616,293

[22] Filed: Mar. 15, 1996

Related U.S. Application Data

[62] Division of Ser. No. 459,855, Jun. 2, 1995, Pat. No. 5,514,891.

[51] Int. Cl.$^6$ .................. H01L 21/265; H01L 21/00; H01L 21/20; H01L 21/30
[52] U.S. Cl. .................. 437/36; 437/41; 437/80; 437/133
[58] Field of Search .................. 437/40 LC, 41 LC, 437/36, 80, 126, 132, 133; 257/192, 346

[56] References Cited

U.S. PATENT DOCUMENTS

| | | | |
|---|---|---|---|
| 4,746,627 | 5/1988 | Zuleeg | 437/126 |
| 4,965,645 | 10/1990 | Solomon | 257/192 |
| 5,116,774 | 5/1992 | Huang et al. | 437/40 LC |

*Primary Examiner*—Brian Dutton
*Attorney, Agent, or Firm*—Eugene A. Parsons

[57] ABSTRACT

An N-type HIGFET (10) utilizes two etch layers (17,18) to form a gate insulator (16) to be shorter that the gate electrode (21). This T-shaped gate structure facilitates forming source (23) and drain (24) regions that are separated from the gate insulator (16) by a distance (22) in order to reduce leakage current and increase the breakdown voltage.

17 Claims, 1 Drawing Sheet

N-TYPE HIGFET AND METHOD

This is a division of application Ser. No. 08/459,855, filed Jun. 2, 1995, now U.S. Pat. No. 5,514,891.

BACKGROUND OF THE INVENTION

The present invention relates, in general, to semiconductor transistors, and more particularly, to heterostructure transistors.

Heterostructure insulated gate field effect transistors (HIGFET's) are well known to those skilled in the art and are widely used for a variety of applications including complementary digital circuits. These prior HIGFET's generally are formed by growing a high mobility channel layer on a gallium arsenide substrate, followed by an aluminum gallium arsenide insulator covering the channel layer. A refractory metal gate is applied on the portion of the insulator. Other portions of the insulator extend over other portions of the transistor including source and drain areas, and generally covers the entire transistor.

One problem with these prior HIGFET's is the high gate leakage current. In complementary circuits, this high leakage current increases the standby power dissipation.

Also, N-type HIGFET's have a turn-on voltage, typically about 1.5 volts, that is lower than P-type HIGFET's, generally about 1.8 volts. This low turn-on voltage also results in high standby power dissipation.

Accordingly, it is desirable to have HIGFETs that have a low gate leakage current.

DETAILED DESCRIPTION OF THE DRAWINGS

Figure 1:
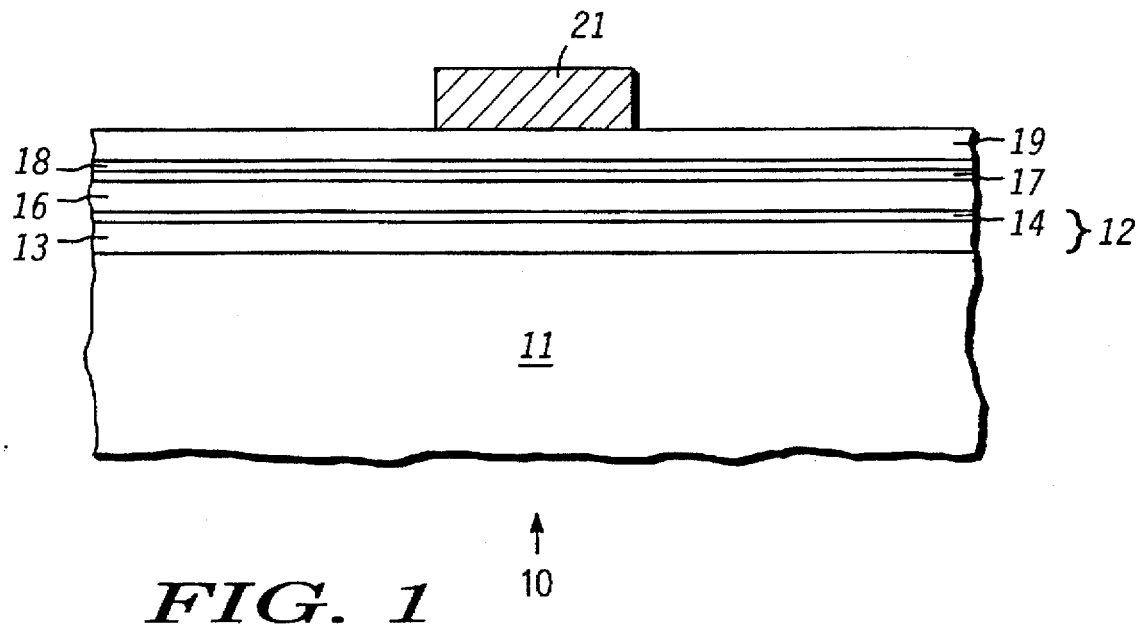
FIG. 1 illustrates an enlarged cross-sectional portion of a HIGFET at a stage in manufacturing in accordance with the present invention.

FIG. 1 illustrates an enlarged cross-sectional portion of a N-type heterostructure insulated gate field effect transistor (HIGFET) 10 at a stage in manufacturing. Transistor 10 has a III-V substrate that includes a channel layer 12 formed by epitaxial techniques that are well known to those skilled in the art. Channel layer 12 forms a heterojunction with substrate 11. Substrate 11 can be any well-known III-V material such as gallium arsenide, indium phosphide, or ternary materials such as indium gallium arsenide. In the preferred embodiment, substrate 11 is semi-insulating gallium arsenide. Channel layer 12 can be a variety of III-V materials that have a high mobility such as indium gallium arsenide. In the preferred embodiment, channel layer 12 includes an indium gallium arsenide high mobility layer 13 that is covered by a protective layer 14. As will be seen hereinafter, protective layer 14 is a layer of substantially intrinsic gallium arsenide that is utilized to protect layer 13 during subsequent processing operations. In other embodiments, protective layer 14 may be omitted.

A high aluminum content insulator 16 is formed on channel layer 12 and results in a heterojunction therebetween. Channel Layer 12 will subsequently be patterned to form the gate insulator of transistor 10. Insulator 16 has an aluminum content greater than 50 percent so that insulator 16 has a high bandgap and to permit selective etching of insulator 16 as will be seen hereinafter. For example, insulator 16 can be aluminum gallium arsenide ($Al_xGa_{1-x}As$) for a gallium arsenide substrate 11 or aluminum indium arsenide ($Al_xIn_{1-x}As$) in the case of an indium phosphide substrate 11 or other high aluminum content insulator that is compatible with the material used for layer 12. In the preferred embodiment, insulator 16 is AlGaAs having an aluminum content between approximately seventy and eighty percent. Also in the preferred embodiment, insulator 16 is approximately 200–300 angstroms thick in order to ensure high transconductance.

A first etch stop layer 17 is formed on insulator 16 in order to facilitate selectively etching overlying layers as will be seen hereinafter. Layer 17 also serves to prevent oxidation of insulator 16. The material utilized for layer 17 generally is not etched by procedures and chemicals that will etch underlying insulator 16. Layer 17 can be substantially intrinsic gallium arsenide or indium gallium arsenide. A second etch stop layer 18 is formed on first etch stop layer 17 in order to facilitate selectively etching both underlying and overlying layers of transistor 10. Layer 18 generally is formed from materials that facilitate etching underlying and overlying layers of transistor 10 as will be seen hereinafter. In the preferred embodiment, layer 17 is substantially intrinsic gallium arsenide that is less than approximately fifty angstroms because such thickness is sufficient as an etch stop, and to prevent over-etching other layers as will be seen hereinafter. Also in the preferred embodiment, layer 18 is substantially intrinsic aluminum arsenide that is less than approximately fifty angstroms because such thickness is sufficient as an etch stop, and to prevent overetching other layers as will be seen hereinafter. The etch-stop layers are needed when complementary N-type and P-type transistors are formed on the same substrate.

A doped gallium arsenide layer 19 is formed on layer 18 to assist in reducing gate leakage current as will be seen hereinafter, and will subsequently be patterned. A gate material is applied to layer 19 and patterned to form a gate electrode or gate 21. The material utilized for gate 21 typically is a refractory metal, for example an alloy of titanium-tungsten-nitride (TiWN), tungsten-nitride (WN), or tungsten-silicide (WSi). Gate 21 is formed by applying a layer of the gate material to the surface of layer 19 and then removing all but the portion forming gate 21. In the preferred embodiment, a reactive ion etch is utilized to form gate 21.

Figure 2:
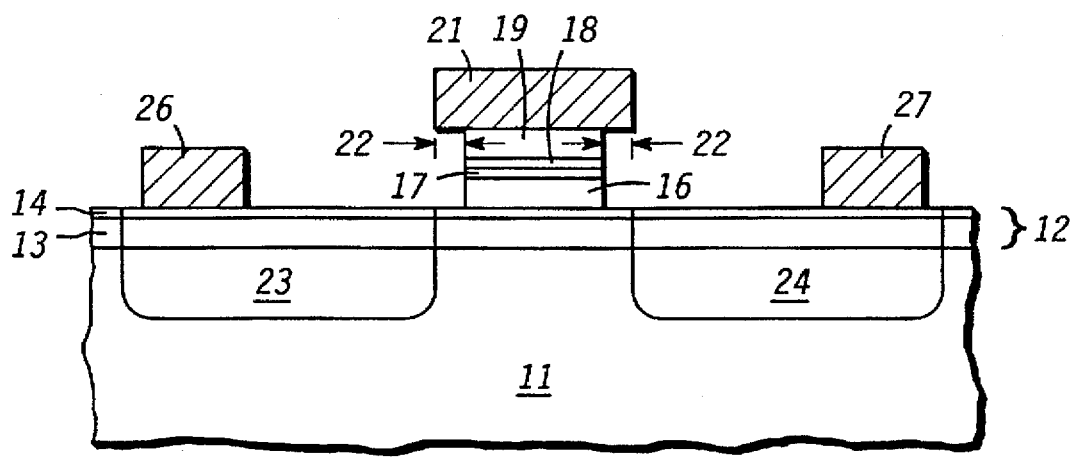
FIG. 2 illustrates the HIGFET of FIG. 1 after subsequent processing operations in accordance with the present invention.

FIG. 2 illustrates an enlarged cross-sectional portion of transistor 10 in a subsequent stage of manufacturing. Gate 21 is utilized as a mask for undercutting material from gate 21 to form a T-shaped gate structure wherein gate 21 is a cross-member of the T-shaped structure and underlying layers form a base of the T-shaped structure. Exposed portions or a first portion of doped gallium arsenide layer 19 that is not covered by gate 21 are removed. This operation also undercuts gate 21 as a second portion of the layer 19 is also removed under the edges of gate 21. Underlying layer 18 serves as an etch stop which prevents the removal operation from affecting underlying portions of transistor 10, consequently, the removal operation also exposes a first portion of layer 18. In the preferred embodiment, citric acid is utilized to etch layer 19.

Subsequently, first portion of layer 18 is removed by using an etchant that does not affect gate 21 or remaining portions of layer 19. A dielectric layer, such as silicon nitride, may first be applied on gate 21, and defined and etched prior to forming gate 21 in order to protect gate 21 from subsequent etching operations. In the preferred embodiment, a one-to-one solution of water and hydrochloric acid at forty degrees Celsius (40° C.) is used. While removing the first portion of layer 18, a first portion of layer 17 is exposed. This first portion of layer 17 serves as an etch stop to prevent affecting other layers of transistor 10. Subsequently, this first portion or exposed portion of layer 17 is removed by an etchant that does not affect underlying insulator 16. In the preferred embodiment, a citric acid solution is used. This etching operation also affects the remaining portion of layer 19, however, because layer 17 is much thinner than layer 19, the operation has minimal affect on layer 19. Because insulator 16 serves as an etch stop for this removal process, a first portion of insulator 16 is exposed. This first portion of insulator 16 is removed by a process that does not affect underlying layer 12. In the preferred embodiment, the first portion of insulator 16 is removed by using a one to one mixture of hydrochloric acid and water at approximately 40° C.

Thereafter, gate 21 is utilized as a mask for forming N-type dopants in substrate 11 in order to form a source region 23 and drain region 24 of transistor 10. After activating the dopants, a source electrode 26 is formed on region 23, and a drain electrode 27 is formed on region 24.

Insulator 16 and layers 17, 18, and 19 function as a base of the T-shaped gate structure, and support the cross-member formed by gate 21. By utilizing this T-shaped gate structure as a mask while forming source region 23 and drain region 24, an edge of each region 23 and 24 is separated from an edge of insulator 16 by a first distance 22. In the preferred embodiment, distance 22 is approximately fifty to one thousand angstroms (50 to 1000 Å). Because insulator 16 is separated from source region 23 and drain region 24, distance 22 results in reduced perimetric gate leakage current by minimizing the drain induced hot electron current flow between gate 21 and drain 24, and also traps near source region 23 and drain region 24.

Additionally, doped gallium arsenide layer 19 also reduces gate leakage current by increasing the barrier height between gate 21 and channel layer 12. Typically, the barrier height is greater than 1.3 eV. In the preferred embodiment the barrier height is approximately 1.7 eV. The P-type doping in layer 19 is as high as possible in order to reduce the depletion region in layer 19, thus, preventing layer 19 from affecting the transconductance of transistor 10. In the preferred embodiment, layer 19 has a P-type doping concentration of at least $1 \times 10^{19}$ atoms/cm$^3$. Additionally, layer 19 should be as thin as possible to minimize the effect on the electric field between gate 21 and channel layer 12, and as thick as required to prevent depletion of the dopants. In the preferred embodiment, layer 19 is approximately five hundred to one thousand angstroms (500–1000 Å) thick. As a result, transistor 10 has a gate leakage current that is approximately ten times lower that prior art N-type HIGFETs. Additionally, distance 22 also increases the breakdown voltage of transistor 10 at least two times the breakdown voltage of prior art N-type HIGFETs.

It should be noted that transistor 10 can be used as a single transistor, or in an integrated circuit with other types of transistors, or used to form an N-type transistor in a complementary pair of transistors, i.e. along with a P-type transistor.

By now it should be appreciated that there has been provided a novel HIGFET and method. Utilizing a high aluminum content insulator covered by two etch stop layers facilitates selectively etching material underlying the gate in order to form a T-shaped gate structure. Utilizing the T-shaped gate structure as a mask while forming source and drain implants results in a distance between the gate insulator and the source and drain regions, thereby reducing perimetric gate leakage current. Additionally, utilizing a P-type layer between the gate and the gate insulator increases the barrier height of the transistor thereby further reducing leakage current.

We claim:

1. A method of forming an N-type HIGFET comprising:

providing a III–V substrate having a channel layer that forms a heterojunction and includes a layer of indium gallium arsenide and a gallium arsenide protective layer on the layer of indium gallium arsenide;

forming an insulator on the substrate, the insulator having an aluminum content greater than approximately 50%;

forming a first etch stop layer on the insulator;

forming a second etch stop layer on the first etch stop layer;

forming a doped gallium arsenide layer on the second etch stop layer;

forming a gate electrode on the doped gallium arsenide layer;

undercutting the gate electrode by removing a portion of the doped gallium arsenide layer from under the gate electrode, thereby exposing a portion of the second etch stop layer;

removing the portion of the second etch stop layer and exposing a portion of the first etch stop layer;

removing the portion of the first etch stop layer; and using the gate electrode as a mask while forming a dopant in the substrate so that an edge of the dopant in the substrate is a first distance from an edge of the insulator.

2. The method of claim 1 wherein the substrate is one of gallium arsenide, indium phosphide, or indium gallium arsenide.

3. The method of claim 1 wherein the insulator is one of aluminum gallium arsenide or aluminum indium arsenide.

4. The method of claim 1 wherein the insulator has an aluminum content greater than approximately 50% includes using an aluminum content greater than approximately 75%.

5. The method of claim 1 wherein the first etch stop layer is one of substantially intrinsic gallium arsenide or substantially intrinsic indium gallium arsenide.

6. The method of claim 1 wherein the etch stop layer has a thickness less than approximately 50 angstroms.

7. The method of claim 1 wherein the second etch stop layer is substantially intrinsic aluminum arsenide.

8. The method of claim 1 wherein the second etch stop layer has a thickness less than approximately 50 angstroms.

9. The method of claim 1 wherein the first distance is approximately 50 to 1000 angstroms.

10. The method of claim 1 wherein the step of undercutting the gate electrode includes selectively etching the doped gallium arsenide layer for removing the portion of the doped gallium arsenide layer.

11. The method of claim 1 wherein the doped gallium arsenide layer has a P-type doping concentration of at least approximately $1 \times 10^{19}$ atoms/cm$^3$.

12. A method of forming a gallium arsenide HIGFET comprising:

providing a gallium arsenide substrate having a channel layer;

forming an insulator on the substrate, the insulator having an aluminum content greater than approximately 50%;

forming a substantially intrinsic gallium arsenide layer on the insulator;

forming a substantially intrinsic aluminum arsenide layer on the substantially intrinsic gallium arsenide layer;

forming a doped gallium arsenide layer on the substantially intrinsic aluminum arsenide layer;

forming a gate material on the doped gallium arsenide layer;

removing a first portion of the gate material while leaving a second portion of the gate material on the doped gallium arsenide layer, and exposing a first portion of the doped gallium arsenide layer;

removing the first portion of the doped gallium arsenide layer and undercutting the second portion of the gate material by removing a second portion of the doped gallium arsenide layer from under the second portion of the gate material, thereby exposing a first portion of the substantially intrinsic aluminum arsenide layer;

removing the first portion of the substantially intrinsic aluminum arsenide layer, thereby exposing a first portion of the substantially intrinsic gallium arsenide layer;

removing the first portion of the substantially intrinsic gallium arsenide layer, thereby exposing a first portion of the insulator;

removing the first portion of the insulator; and using the second portion of the gate material as a mask while forming a dopant in the substrate so that an edge of the dopant in the substrate is a first distance from an edge of the insulator.

13. The method of claim 12 wherein the insulator is one of aluminum gallium arsenide or aluminum indium arsenide.

14. The method of claim 12 wherein the alloy is one of titanium-tungsten-nitride (TiWN), tungsten-nitride (WN), or tungsten-silicide (WSi).

15. The method of claim 12 wherein the step of removing the first portion of the doped gallium arsenide layer and undercutting the second portion of the gate material includes selectively etching the doped gallium arsenide layer.

16. The method of claim 15 wherein the step of selectively etching the doped gallium arsenide layer includes using a citric acid etchant.

17. The method of claim 12 wherein the step of removing the first portion of the substantially intrinsic aluminum arsenide layer includes selectively etching the intrinsic aluminum arsenide layer using an etchant of water and hydrochloric acid at approximately 40° Celsius.

* * * * *